(12) United States Patent
Hoentschel et al.

(10) Patent No.: US 8,669,151 B2
(45) Date of Patent: Mar. 11, 2014

(54) HIGH-K METAL GATE ELECTRODE STRUCTURES FORMED AT DIFFERENT PROCESS STAGES OF A SEMICONDUCTOR DEVICE

(75) Inventors: Jan Hoentschel, Dresden (DE); Sven Beyer, Dresden (DE); Thilo Scheiper, Dresden (DE); Uwe Griebenow, Markkleeberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 666 days.

(21) Appl. No.: 12/909,291

(22) Filed: Oct. 21, 2010

(65) Prior Publication Data
US 2011/0156154 A1 Jun. 30, 2011

(30) Foreign Application Priority Data
Dec. 30, 2009 (DE) .......................... 10 2009 055 392

(51) Int. Cl.
*H01L 21/8234* (2006.01)
(52) U.S. Cl.
USPC .......................................... 438/197; 257/369
(58) Field of Classification Search
USPC .......... 438/197, 142; 257/410, E29.137, 371, 257/374, 411, 412, 369, 407, E27.064, 257/E29.165, E29.16
See application file for complete search history.

(56) References Cited

U.S. PATENT DOCUMENTS

| | | | |
|---|---|---|---|
| 2006/0286729 A1* | 12/2006 | Kavalieros et al. | 438/183 |
| 2009/0117726 A1* | 5/2009 | Pas | 438/592 |
| 2009/0230479 A1* | 9/2009 | Hsu et al. | 257/369 |

OTHER PUBLICATIONS

Translation of Official Communication from German Patent Office for German Patent Application No. 10 2009 055 392.4 dated Oct. 11, 2010.

\* cited by examiner

*Primary Examiner* — Fernando L Toledo
*Assistant Examiner* — Robert Bachner
(74) *Attorney, Agent, or Firm* — Amerson Law Firm, PLLC

(57) ABSTRACT

Sophisticated high-k metal gate electrode structures are provided on the basis of a hybrid process strategy in which the work function of certain gate electrode structures is adjusted in an early manufacturing stage, while, in other gate electrode structures, the initial gate stack is used as a dummy material and is replaced in a very advanced manufacturing stage. In this manner, superior overall process robustness in combination with enhanced device performance may be achieved.

17 Claims, 6 Drawing Sheets

HIGH-K METAL GATE ELECTRODE STRUCTURES FORMED AT DIFFERENT PROCESS STAGES OF A SEMICONDUCTOR DEVICE

BACKGROUND OF THE INVENTION

1. Field of the Invention

Generally, the present disclosure relates to the fabrication of sophisticated integrated circuits including transistor elements comprising highly capacitive gate structures on the basis of a high-k dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. It turns out that decreasing the channel length requires an increased capacitive coupling between the gate electrode and the channel region to avoid the so-called short channel behavior during transistor operation. The short channel behavior may lead to an increased leakage current and to a pronounced dependence of the threshold voltage on the channel length. Aggressively scaled transistor devices with a relatively low supply voltage, and thus reduced threshold voltage, may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide-based dielectrics, at least in part, as the material for gate insulation layers has been considered, particularly for extremely thin silicon dioxide-based gate layers. Possible alternative materials include materials that exhibit a significantly higher permittivity so that a physically greater thickness of a correspondingly formed gate insulation layer provides a capacitive coupling that would otherwise be obtained by an extremely thin silicon dioxide layer.

Additionally, transistor performance may be increased by providing an appropriate conductive material for the gate electrode to replace the usually used polysilicon material, at least in the vicinity of the gate dielectric material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide-based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone and providing superior conductivity compared to the doped polysilicon material. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration and the performance characteristics thereof has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the completed transistor structures. Moreover, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like. In other approaches, appropriate work function metals may be diffused into the gate dielectric material prior to actually patterning the gate electrode structures, thereby placing dipole charges in the gate dielectric material as required for adjusting the desired work function for the different transistors types. Hence, during the further processing, a pronounced temperature dependency may require a strict control of the thermal budget, which in turn may contribute to an increased variability of the transistor characteristics. Furthermore, frequently, the channel region of one type of transistor may require a band gap offset compared to a pure silicon channel in order to obtain a desired work function on the basis of a specific work function metal, such as aluminum for P-channel transistors, wherein, however, the adjustment of the band gap offset is typically accomplished by epitaxially forming a semiconductor material, such as a silicon/germanium mixture, in the channel region, which in turn necessitates well-controlled processes that may reduce overall throughput.

For these reasons, in other approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, if required, followed by the deposition of an interlayer dielectric material, such as silicon nitride in combination with silicon dioxide and the like. In this manufacturing stage, a top surface of the gate electrode structures embedded in the interlayer dielectric material may be exposed, for instance by chemical mechanical polishing (CMP) and the like. The polysilicon material may be removed in a selective etch process and thereafter an appropriate masking regime may be applied in order to selectively fill in an appropriate metal for each type of transistor, which may be accomplished by filling in the first metal species and selectively removing the metal species from one of the gate electrode structures. Thereafter, a further metal material may be deposited, thereby obtaining the desired work function for each type of transistor. Finally, the gate electrodes are filled with an electrode metal, thereby providing a full metal gate electrode structure for N-channel and P-channel transistors.

Although in general this approach may provide advantages in view of reducing process-related non-uniformities in the threshold voltages of the transistors, since the high-k dielectric material may be reliably encapsulated during the entire process sequence without requiring an adjustment of the work function and thus the threshold voltage at an early manufacturing stage, the complex process sequence for removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

Furthermore, in replacement gate approaches, certain changes in the overall design of the semiconductor device may be required in order to take into account the presence of circuit elements, such as non-transistor elements, in which the placeholder polysilicon material may also be removed, which, however, may thus significantly change the overall electronic behavior. For example, resistors and capacitors may frequently be formed on the basis of the polysilicon material that may conventionally also be used as the electrode material of the gate electrode structures in approaches in which the high-k dielectric material and the work function adjusting metal electrode material are provided in an early manufacturing stage, thereby imparting significantly different conductivity to such passive circuit elements. Furthermore, in a replacement gate approach, the silicon material of the placeholder electrode structures is completely replaced by a metal, which seems to increase the overall fringing capacitance of the resulting gate electrode structures.

Consequently, the high-k metal gate first approach and the replacement gate approach may have certain disadvantages, which in turn may result in a less pronounced gain in performance of sophisticated semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which superior device performance may be achieved by applying a process strategy in which sophisticated gate electrode structures for some transistor elements may be provided in an early manufacturing stage, while the gate electrode structures for other transistor elements may be completed at a very advanced manufacturing stage, thereby eliminating one or more of the problems that are associated with the gate first approach and the replacement gate approach described above. Thus, by applying a "hybrid" process strategy in terms of semiconductor based high-k metal gate electrode structures and full metal high-k gate electrode structures, performance of different transistor types, such as N-channel transistors and P-channel transistors, may be individually enhanced, while, however, avoiding many of the problems associated with these conventional strategies. For example, the work function of transistors of a first type may be efficiently adjusted by providing an appropriate work function metal in an early manufacturing stage, whereas the work function metal and the additional semiconductor-based electrode material may act as a placeholder material for transistors of a different type. Consequently, significantly improved process conditions may be established during the replacement of the electrode material with only one type of work function metal, thereby, for instance, avoiding or at least reducing deposition and patterning related irregularities which may otherwise occur in conventional replacement gate approaches as discussed above. Moreover, the concept of providing certain gate electrode structures in an early manufacturing stage while completing the gate electrode structures of other transistors on the basis of a replacement process strategy may increase the flexibility in implementing additional performance enhancing mechanisms, such as strain-inducing mechanisms, which, thus, even further contribute to a superior overall device performance.

One illustrative method disclosed herein comprises forming a first gate electrode structure of a first transistor and a second gate electrode structure of a second transistor on the basis of a first electrode material that comprises a first work function adjusting species for adjusting a work function of the first gate electrode structure. The method further comprises forming drain and source regions of the first and second transistors and thereafter removing the first electrode material from the second gate electrode structure so as to form a gate opening, while at least a portion of the first electrode material is preserved in the first gate electrode structure. Additionally, the method comprises filling the gate opening with a second electrode material that comprises a second work function adjusting metal species for adjusting a work function of the second gate electrode structure.

A further illustrative method disclosed herein relates to forming a semiconductor device. The method comprises forming a gate layer stack above a first active region of a first transistor and above a second active region of a second transistor, wherein the gate layer stack comprises a gate dielectric material and a first electrode material having a first work function that is appropriate for the first transistor. The method further comprises forming a first gate electrode structure on the first active region and a second gate electrode structure on the second active region from the gate layer stack. Additionally, the method comprises replacing the first electrode material in the second gate electrode structure with a second electrode material having a second work function that is appropriate for the second transistor.

One illustrative semiconductor device disclosed herein comprises a first transistor comprising a first gate electrode structure, which comprises a first gate insulation layer including a high-k dielectric material. Moreover, the first gate electrode structure comprises a first electrode metal formed on the first gate insulation layer and comprises a first work function adjusting species and a semiconductor material. The semiconductor device further comprises a second transistor comprising a second gate electrode structure. The second gate electrode structure comprises a second gate insulation layer including the high-k dielectric material and a second non-semiconductor electrode material that comprises a second work function adjusting species.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a cross-sectional view of the semiconductor device in a further advanced manufacturing stage, in which gate electrode structures for different transistors have been formed on the basis of the gate layer stack of FIG. 1a;

Figure 1A:
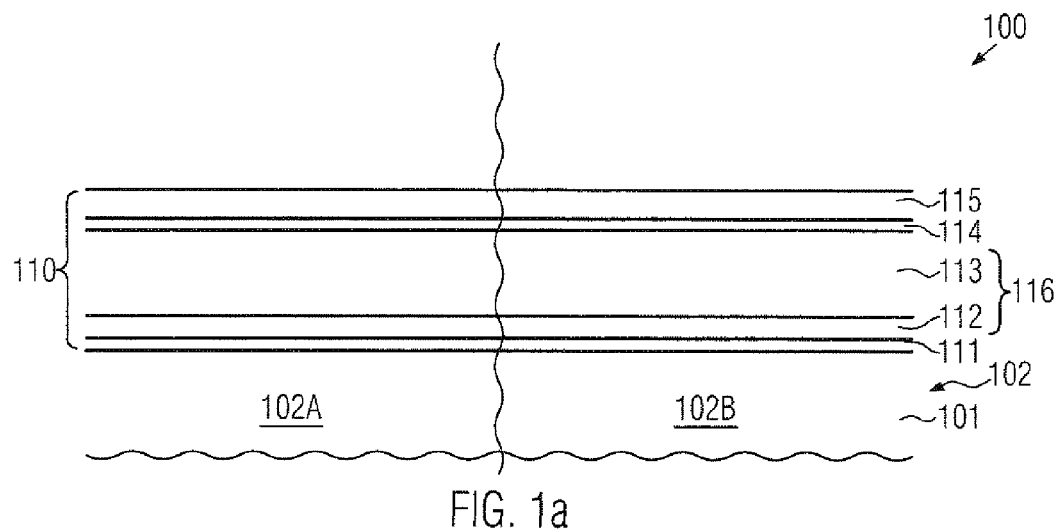
FIG. 1a schematically illustrates a cross-sectional view of a semiconductor device in an early manufacturing stage, in which a gate layer stack may be provided so as to be appropriate for forming a sophisticated gate electrode structure of one type of transistor, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which the gate electrode structure of one type of transistor, such as N-channel transistors or P-channel transistors, may be formed in an early manufacturing stage on the basis of an appropriate electrode material, such as a semiconductor-based electrode material in combination with a metal-containing material including an appropriate work function metal species so as to obtain the required work function and, thus, threshold voltage of the transistor under consideration. For example, sophisticated diffusion processes may not be required, since the electrode material per se, i.e., the portion formed at and in the vicinity of the gate dielectric material, may have an appropriate material composition, for instance by providing lanthanum and the like, so as to obtain the desired work function for the transistor under consideration. On the other hand, the electrode material may be used as an efficient placeholder material for other types of transistors, which may result in a uniform process flow for patterning the gate layer stack, thereby also achieving a high degree of uniformity with respect to critical dimensions, such as the gate length of the finally obtained gate electrode structures. Furthermore, providing the gate electrode structure in an early manufacturing stage without requiring a replacement of the electrode material in an advanced manufacturing stage may provide the possibility of implementing additional strain-inducing mechanisms, such as so-called stress memorization techniques, in which the semiconductor material in drain and source regions may at least once be substantially amorphized and re-crystallized in the presence of a rigid material layer, thereby causing a strained regrowth of the previously amorphized semiconductor material. The resulting strain may be preserved, even after removal or partial removal of the rigid cover layer, wherein the corresponding strain effect may particularly be achieved by avoiding any modifications on the gate electrode structure. For example, a stress memorization technique may be efficiently applied to N-channel transistors in order to create a tensile strain component in the channel region, wherein the corresponding semiconductor-based gate electrode structure may provide a high degree of strain conservation without being affected by any replacement gate processes during the further processing. On the other hand, the placeholder electrode material in P-channel transistors may be processed on the basis of superior process conditions, since substantially the same gate layer stack may be used for the N-channel transistor and the P-channel transistor, wherein an additional provision of a band gap adjusting semiconductor material in the channel region may also be avoided, as may typically be required in many high-k metal gate first approaches, as discussed above. The appropriate work function material may then be applied during a selective replacement of the placeholder electrode material for the P-channel transistor in a very advanced manufacturing stage. Due to the superior process conditions upon replacing the semiconductor-based electrode material and refilling the gate opening with the appropriate electrode material, enhanced uniformity in terms of transistor characteristics may also be achieved, thereby contributing in total to a superior process robustness when fabricating complex semiconductor devices in volume production processes. Furthermore, the selective replacement of the placeholder material may also enable the implementation of additional strain-inducing mechanisms, such as providing the electrode material or at least a significant portion thereof with the desired high internal stress level, which may thus result in a further enhancement of charge carrier mobility and, thus, current drive capability of the transistor under consideration.

In this context, it is to be appreciated that transistor performance may be efficiently enhanced by increasing the charge carrier mobility in the corresponding channel regions of the transistors, which may be accomplished by inducing a certain strain component in the channel region. For example, for a standard crystallographic configuration of a silicon-based channel region, the provision of a compressive strain component along the current flow direction may result in increased mobility of holes, which may, thus, translate into an improvement of transistor performance of P-channel transistors. On the other hand, creating a tensile strain component may increase electron mobility, which may, thus, result in superior N-channel transistor performance. Consequently, the concept of hybrid sophisticated high-k metal gate electrode structures enables efficiently implementing additional strain-inducing mechanisms, thereby contributing to superior transistor performance in combination with increased process robustness.

It should be appreciated that the principles disclosed herein may be efficiently applied to a strategy in which the configuration and in particular the work function of the gate electrode structure of N-channel transistors may be set in an early manufacturing stage, for instance by providing a specific work function metal species, by creating dipole charges on the basis of diffusion techniques and the like, while the gate electrode structure of P-channel transistors may be completed later on the basis of a replacement strategy. However, in other cases, the gate electrode structures of P-channel transistors may be provided at an early manufacturing stage, while the final gate electrode structure of N-channel transistors may be completed in a very advanced manufacturing stage. Moreover, the principles disclosed herein may also be applied to transistors of different characteristics, which may not necessarily represent complementary transistors. Consequently, the present disclosure should not be considered as being restricted to complementary transistors, in which the work function of the gate electrode structures of N-channel transistors may be adjusted in an early manufacturing stage, as long as any such implementations are explicitly referred to in the following detailed description and/or the appended claims.

FIG. 1a schematically illustrates a cross-sectional view of a semiconductor device 100 comprising a substrate 101, such as a silicon substrate, an insulating substrate and the like, above which may be provided a semiconductor layer 102, such as a silicon-based semiconductor material, a silicon/germanium material and the like. It should be appreciated that the substrate 101 may represent any appropriate carrier material for forming thereon or therein the semiconductor layer 102, which in turn may be comprised of any appropriate semiconductor material in order to form therein and thereabove field effect transistors. As previously discussed, silicon-based semiconductor materials may frequently be used for highly complex semiconductor devices that are to be formed on the basis of volume production techniques so that silicon is a preferable material for the semiconductor layer 102. It is further to be noted that the substrate 101 in combination with the semiconductor layer 102 may represent a silicon-on-insulator (SOI) configuration, when a buried insulating material (not shown) is formed between the substrate 101 and the semiconductor layer 102. In other cases, the semiconductor layer 102 may represent a portion of a crystalline material of the substrate 101, which may also be referred to herein as a "bulk" configuration. Furthermore, the semiconductor layer 102 may represent a globally strained semiconductor material, if considered appropriate in enhancing overall performance of the semiconductor device 100. The semiconductor layer 102 may comprise a plurality of semiconductor regions or active regions 102A, 102B, which are to be understood as any semiconductor regions in and above which one or more transistor elements are to be formed. The active regions 102A, 102B may be laterally delineated by appropriate isolation structures (not shown), such as shallow trench isolations and the like. In the embodiment shown, the active region 102A may represent the active region of an N-channel transistor, while the active region 102B may represent the active region of a P-channel transistor. As discussed above, however, in other cases, any other configuration of the active regions 102A, 102B may be applied, for instance, providing the active region 102A for a P-channel transistor, while the active region 102B may represent an N-channel transistor. Furthermore, the active regions 102A and 102B may represent the active regions of non-complementary transistors, which, however, may require different characteristics for the corresponding gate electrode structures still to be formed on the active regions 102A, 102B.

In the manufacturing stage shown in FIG. 1a, a gate layer stack 110 may be formed on the active regions 102A, 102B and may have any appropriate configuration so as to obtain the desired gate electrode characteristics for a transistor to be formed in and above the active region 102A. The gate layer stack 110 may, thus, comprise a gate dielectric layer 111, which may be comprised of any appropriate material composition so as to provide superior capacitive coupling at an acceptable level of leakage, as discussed above. It should be appreciated that the gate dielectric material 111 may have a dielectric constant that is in total greater than the dielectric constant of any conventional dielectric materials, such as silicon dioxide, silicon oxynitride, silicon nitride and the like. For this reason, the gate dielectric material 111 may be referred to as a gate dielectric material comprising a high-k dielectric material. It should be appreciated that the layer 111 may be provided in the form of two or more individual layers, for instance, a silicon dioxide-based material layer having a thickness of approximately 0.8 nm or less, followed by a further dielectric material, such as a high-k dielectric material in the form of hafnium oxide, hafnium silicon oxide, zirconium oxide and the like, with a thickness of 0.8 to several nanometers, depending on the overall device requirements. Moreover, the gate layer stack 110 may comprise an electrode material 116, which may include a conductive metal-containing material layer 112 and a semiconductor-based material 113, for instance, in the form of amorphous silicon, polysilicon, a silicon/germanium mixture and the like. The layer 112, which may also be referred to as a metal-containing cap layer may include any appropriate work function metal species, such as lanthanum, aluminum and the like, depending on the type of transistor to which the resulting work function of the material 113 in combination with the gate dielectric material 111 is to be adapted. For example, the layer 112 may represent an appropriate conductive material, such as titanium nitride, having incorporated therein the required work function species, such as lanthanum, while, in other cases, the work function metal species may be provided as a separate material layer followed by a titanium nitride material, which may, thus, appropriately confine any sensitive underlying materials, such as the work function metal species and the gate dielectric material 111. For example, an appropriate material, such as lanthanum, with a thickness of several angstrom may be provided in combination with a titanium nitride material having a thickness from one to several nanometers. It should be appreciated, however, that the electrode material 116 may have incorporated therein any appropriate work function metal species in order to obtain the desired work function for the transistor to be formed in and above the active region 102A. Moreover, the gate layer stack 110 may comprise a dielectric cap material, for instance, in the form of layers 114 and 115, such as a silicon dioxide material in combination with a silicon nitride material. It should be appreciated, however, that any other appropriate cap material or materials may be provided, depending on the overall process strategy.

The semiconductor device 110 as illustrated in FIG. 1a may be formed on the basis of the following processes. The active regions 102A, 102B may be formed on the basis of well-established masking regimes in combination with implantation processes for defining the basic electronic characteristics of corresponding transistors to be formed in and above the active regions 102A, 102B. Moreover, prior to or after establishing an appropriate dopant profile in the regions 102A, 102B, isolation structures (not shown) may be formed, for instance by forming trenches and refilling the trenches with an insulating material in accordance with any appropriate manufacturing strategy. Next, the gate dielectric material 111 may be formed, for instance, by forming a dielectric base layer, such as silicon dioxide, silicon oxynitride and the like, followed by the deposition of a high-k dielectric material, such as hafnium oxide and the like. For this purpose, any appropriate deposition techniques, such as chemical vapor deposition (CVD) and the like, may be applied. Thereafter, the layer 112 may be deposited, for instance, by sputter deposition, CVD and the like for providing any appropriate metal species, possibly in combination with an appropriate metal-containing carrier material, such as titanium nitride. Thereafter, the semiconductor-based layer 113 of the electrode material 116 may be formed, for instance, by well-established low pressure CVD techniques, followed by the deposition of the one or more materials 114 and 115. It should be appreciated that, if required, any diffusion processes may be initiated, for instance, for diffusing the work function metal species in the layer 112 towards and into the dielectric material 111, thereby creating fixed dipole charges, when a further modification of the resulting work function is required. A corresponding heat treatment may be performed prior to the deposition of the layer 113 or after completing the gate layer stack 110, depending on the overall process strategy. In other cases, the layer 112 having incorporated therein an appropriate work function metal species may per se have an appropriate work function, without requiring any additional heat treatments for incorporating fixed dipole charges in the material 111. If required, the layer 112 may be replaced by any appropriate material, such as titanium nitride, after having initiated a diffusion of a work function metal species into the dielectric material 111.

Figure 1B:
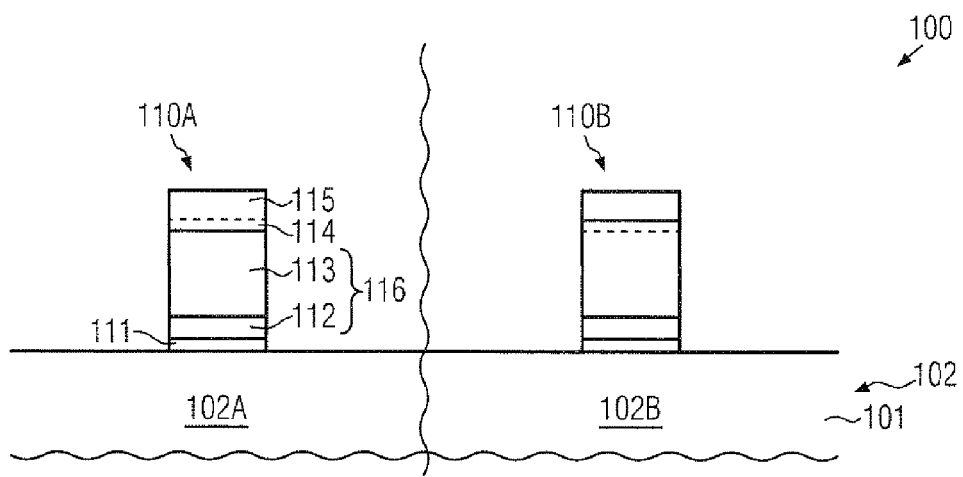

FIG. 1b schematically illustrates the semiconductor device 100 in a further advanced manufacturing stage. As illustrated, a first gate electrode structure 110A is formed on the active region 102A and a second gate electrode structure 110B is formed on the active region 102B, wherein the structures 110A, 110B have substantially the same configuration. That is, the layers 111, 112, 113, 114, 115 may be provided in the gate electrode structures 110A, 110B, wherein the layer 112, possibly in combination with any metal species diffused into the layer 111, may have a work function that is appropriate for a transistor still to be formed on the basis of the gate electrode structure 110A. The gate electrode structures 110A, 110B may be formed on the basis of the gate layer stack 110 as shown in FIG. 1a by using any appropriate lithography and etch strategy, for instance, depositing any hard mask materials, such as amorphous carbon, silicon oxynitride and the like, and by patterning these hard mask materials using sophisticated lithography techniques. Thereafter, the gate layer stack 110 of FIG. 1a may be patterned on the basis of anisotropic etch recipes, wherein, due to the same configuration of the layer stack 110, the gate electrode structures 110A, 110B may be formed with a high degree of uniformity with respect to the critical dimensions or any patterning-related irregularities. Consequently, the processing will be continued on the basis of superior process conditions when providing the basic configuration of transistor elements to be formed on the basis of the gate electrode structures 110A, 110B.

Figure 1C:
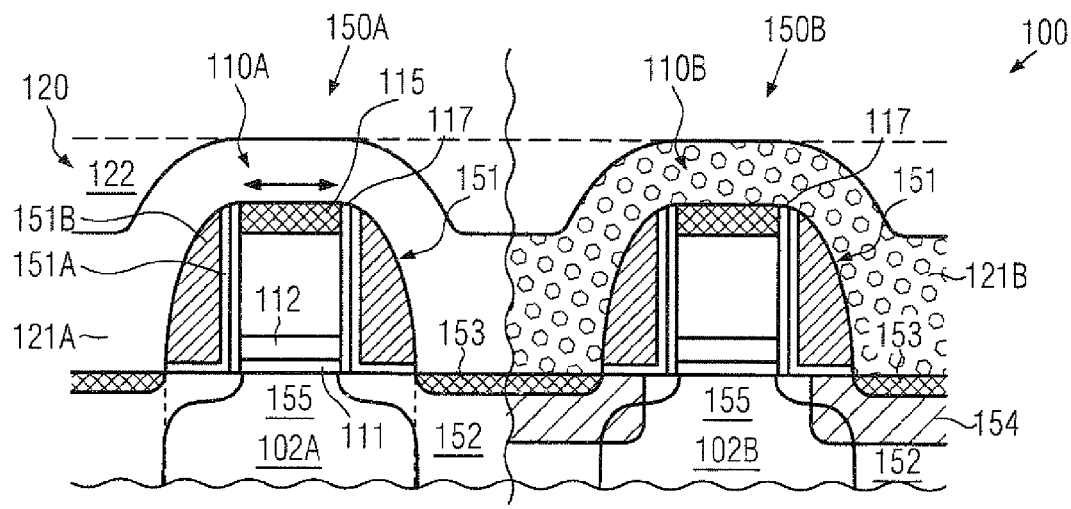
FIGS. 1c-1g schematically illustrate cross-sectional views of the semiconductor device during various manufacturing stages in completing the basic transistor configuration and replacing the electrode material of one type of transistor with an appropriate electrode metal including an appropriate work function adjusting species, according to illustrative embodiments.

FIG. 1c schematically illustrates the semiconductor device 100 in a further advanced manufacturing stage. A first transistor 150A may be formed in and above the active region 102A and may comprise the gate electrode structure 110A. In the embodiment shown, the transistor 150A may represent an N-channel transistor, as discussed above. Moreover, a second transistor 150B may be formed in and above the active region 102B and may represent a P-channel transistor, while, in other cases, as also previously explained, the transistors 150A, 150B may represent any transistors that require different work functions of the gate electrode structures 110A, 110B. The gate electrode structures 110A, 110B may additionally comprise a liner 117, such as a silicon nitride material, which may confine the sensitive materials 111 and 112 so as to avoid any undue modification of the characteristics of at least the gate electrode structure 110A that have been adjusted previously upon providing the gate layer stack 110 as shown in FIG. 1a. Furthermore, the transistors 150A, 150B may comprise a sidewall spacer structure 151 formed on sidewalls of the gate electrode structures 110A, 110B, i.e., on the liner 117. The spacer structure 151 have any appropriate configuration, for instance, an etch stop liner 151A, in combination with a spacer element 151B, while, however, any other appropriate configuration may be applied. Furthermore, the transistors 150A, 150B may have drain and source regions 152 with an appropriate dopant profile so as to obtain the desired configuration of PN junctions in the active regions 102A, 102B, respectively. It should be appreciated that the drain and source regions 152 are of inverse conductivity type for the transistors 150A, 150B when representing complementary transistors. The drain and source regions 152 laterally enclose a channel region 155, which in turn vertically connects to the gate dielectric material 111. Furthermore, metal silicide regions 153 may be provided in a part of the drain and source regions 152, thereby reducing the overall series resistance in the transistors 150A, 150B and also reducing the contact resistance upon forming contact elements in a later manufacturing stage. Furthermore, in some illustrative embodiments, as, for instance, shown in FIG. 1c for the transistor 150B, a strain-inducing mechanism may be implemented on the basis of a strain-inducing semiconductor alloy 154, which may be provided in at least a portion of the drain and source regions 152. For instance, as discussed above, a compressive strain component may increase the charge carrier mobility in the channel region 155, when representing a P-channel transistor. In this case, the material 154 may be provided in the form of a silicon/germanium alloy, a silicon/germanium/tin alloy and the like, which may be formed within the silicon-based active region 102B on the basis of epitaxial growth techniques such that the material 154 is grown in a strained state, which in turn induces a corresponding compressive strain component in the adjacent channel region 155. In other cases, the material 154 may be provided as any other strained semiconductor alloy, such as a silicon/carbon material, which may induce a tensile strain component, if considered appropriate for the transistor 150B.

In other illustrative embodiments, in addition to or alternatively to the strain-inducing mechanism implemented by the material 154, one or both of the transistors 150A, 150B may have implemented therein a further strain-inducing mechanism, for instance achieved by a highly strained state of the initial material of the active regions 102A, 102B. As previously discussed, an efficient strain component, such as a tensile strain component, may be created in a silicon-based material by amorphizing or at least significantly damaging the initially crystalline material and re-crystallizing the material in the presence of a rigid material, such as silicon nitride, which may, thus, result in a re-crystallization in a highly strained state, which may even be preserved to a significant degree after the removal or partial removal of the corresponding rigid material layer. Consequently, in some illustrative embodiments, a portion of the active region 102A, for instance a part of the drain and source regions 152, may represent a highly tensile-strained material, which in turn induces a tensile strain component in the channel region 155, thereby significantly enhancing performance thereof when representing an N-channel transistor.

Moreover, the device 100 may comprise a dielectric material 120, which may at least be formed laterally adjacent to the gate electrode structures 110A, 110B, i.e., adjacent to the spacer structures 151. The material 120 may also be referred to as an interlayer dielectric material, since additional device layers, such as a metallization system, may be formed above the dielectric material 120. In some illustrative embodiments, the material 120 may comprise a first dielectric material 121A, 121B, such as a silicon nitride material and the like, in combination with an additional dielectric material 122, such as a silicon dioxide material. In some illustrative embodiments, the material 120 or at least portions thereof may be used so as to implement a further strain-inducing mechanism, at least for one of the transistors 150A, 150B. In the embodiment shown, the dielectric material 121A may have a high internal stress level, such as a tensile stress, when considering an N-channel transistor, thereby inducing a desired tensile strain component in the channel region 155 of the transistor 150A. On the other hand, the material 121B may be provided in the form of a substantially relaxed dielectric material, while, in other cases, a high internal stress level may be applied in the material 121B, if compatible with the overall process strategy.

The semiconductor device 100 as illustrated in FIG. 1c may be formed on the basis of the following processes. After patterning the gate electrode structures 110A, 110B as shown in FIG. 1b, the protective liner 117 may be formed by well-established deposition techniques, followed by the formation of sacrificial spacer elements for the gate electrode structure 110B, if the incorporation of the material 154 is required. For this purpose, a spacer material may be deposited and may be selectively patterned into the sacrificial spacer elements of the active region 102B, which may, thus, act as etch and growth masks, in combination with the cap material 115 when removing a portion of the material of the active region 102B and refilling the corresponding cavities with the material 154 on the basis of well-established selective epitaxial growth techniques. Thereafter, the sacrificial spacer elements and the spacer layer formed above the gate electrode structure 110A may be removed, while, in other strategies, the previously formed spacer elements may represent permanent spacer elements and corresponding spacer elements may also be formed on the gate electrode structure 110A. In other cases, if the incorporation of the material 154 is not required, for instance, when forming transistor elements of reduced power consumption and the like, the dopant profile of the drain and source regions 152 may be formed on the basis of the protective liner 117, possibly in combination with additional spacer elements (not shown) by using appropriate masking regimes and implantation processes. Moreover, the sidewall spacer structure 151 may be formed in accordance with any appropriate process technique and the spacer structure 151 may be used as an implantation mask for further implantation processes required for obtaining the desired dopant profile of the drain and source regions 152.

As discussed above, in some illustrative embodiments, the strained material 154 may be formed in one or both of the transistors 150A, 150B, which may be accomplished by substantially amorphizing the drain and source areas 152 and forming an appropriate material layer, such as a silicon nitride material, above the active regions 102A, 102B. Upon re-crystallizing the amorphized areas in the presence of the corresponding material, a highly strained state may be obtained, which may also be preserved upon removing the material layer. Without intending to restrict the present disclosure to the following explanation, it is believed that strain conservation during a corresponding stress memorization technique may be in part caused by electrode material 116 so that a superior strain efficiency may be accomplished by avoiding any further modification of the material 116 during the further processing, for instance when replacing the material 116, as is the case for the gate electrode structure 110B, as will be described later on in more detail.

After any anneal processes for activating the dopants, a metal silicide process may be performed in order to obtain the regions 153, which may be accomplished on the basis of any appropriate process strategy. Next, the dielectric material 120 may be deposited, for instance, by plasma assisted CVD techniques, thermally activated CVD techniques and the like. For example, the materials 121A, 121B may be formed by depositing a highly stressed dielectric material layer and subsequently reducing the high internal stress level selectively above the transistor 150b, which may be accomplished by performing an ion implantation process using a heavy implantation species, such as xenon, germanium and the like. It should be appreciated, however, that the basic material of the layers 121A, 121B may have an appropriate internal stress component so as to enhance performance of the transistor 150B and the internal stress level may be selectively reduced or relaxed above the transistor 150A. In still other illustrative embodiments (not shown), the material layers 121A, 121B may be provided as materials at different high internal stress levels, which may be accomplished by using appropriate deposition techniques and masking and patterning strategies.

Finally, the material 122, if required, may be deposited, while, in other cases, the materials 121A, 121B may have a sufficient thickness so as to enable a subsequent planarization process for exposing the electrode material 116. For this purpose, any appropriate planarization technique, such as chemical mechanical polishing (CMP) may be applied, thereby removing excess material of the layer 120 and finally removing the cap materials 115 of the gate electrode structures 110A, 110B.

Figure 1D:
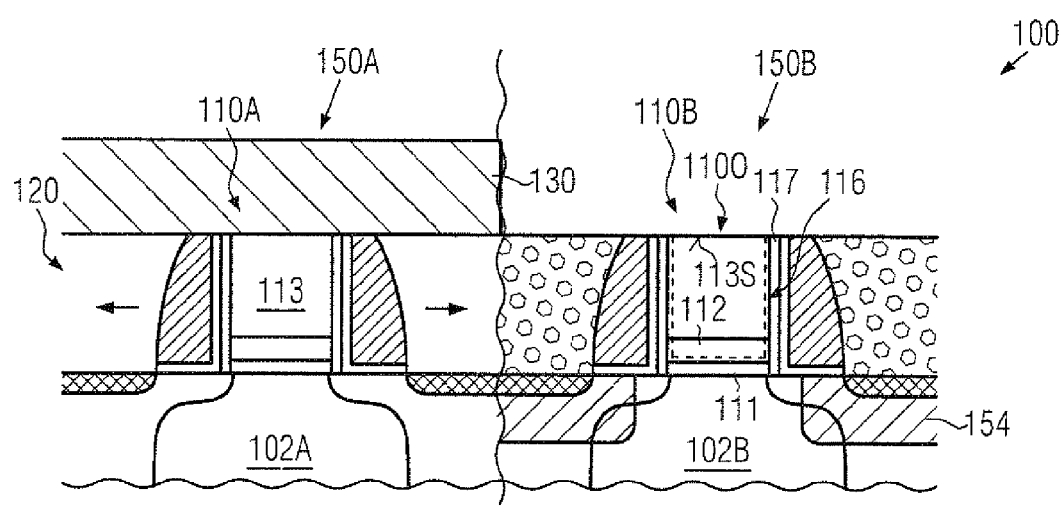

FIG. 1d schematically illustrates the semiconductor device 100 after the removal of the dielectric cap material 115 (FIG. 1c). Moreover, an etch mask 130 may be formed above the transistor 150A, thereby reliably covering a surface 113S of the semiconductor-based portion 113 of the electrode material 116. On the other hand, the surface 113S may be exposed in the transistor 150B. The mask 130 may be provided in the form of any appropriate material, such as silicon dioxide and the like. For this purpose, the mask material may be deposited and may be subsequently patterned on the basis of any appropriate lithography technique.

Consequently, the electrode material 116 of the gate electrode structure 110B, i.e., the materials 113 and the material 112, which may comprise the work function adjusting species that is appropriate for the transistor 150A, may be removed by a selective etch process, for instance based on efficient wet chemical etch recipes using TMAH (tetramethyl ammonium hydroxide) and the like. Consequently, during a corresponding etch process, the material 113 may be efficiently removed, while the layer 112 may act as an etch stop material. Thereafter, any further appropriate etch chemistry may be applied, such as chemistries based on sulfuric acid and hydrogen peroxide, thereby removing the layer 112. Consequently, a gate opening 110O is formed that is laterally delineated by the liner 117, while the bottom of the gate opening 110O is represented by the gate dielectric material 111.

Figure 1E:
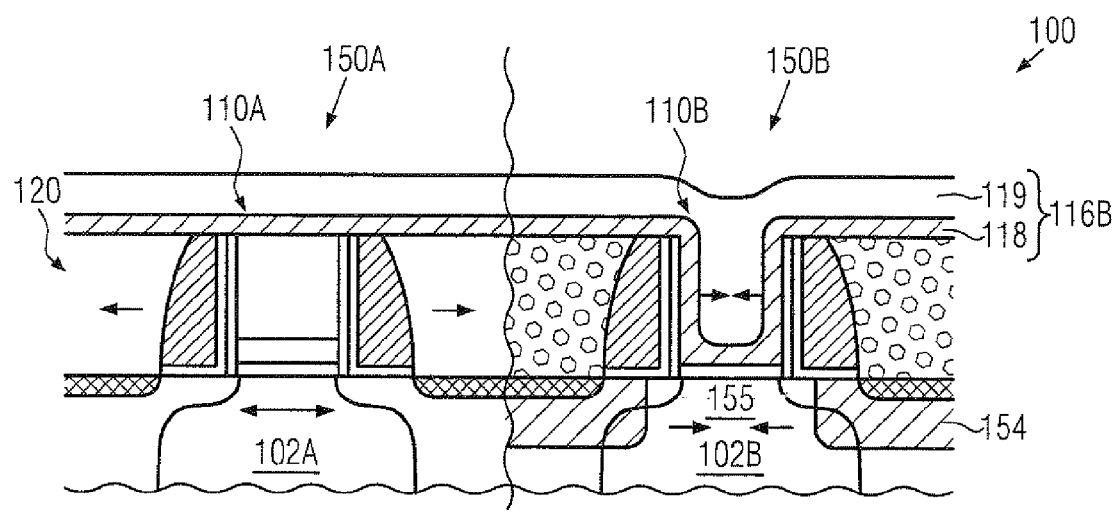

FIG. 1e schematically illustrates the semiconductor device 100 in a further advanced manufacturing stage, in which the gate opening 110O (FIG. 1d) is filled with an electrode material 116B having incorporated therein an appropriate work function metal species for adjusting the work function of the gate electrode structure 110B. For instance, the electrode material 116B may be provided in the form of aluminum, which may be formed on the dielectric material 111 and which may have an appropriate work function for a P-channel transistor. In some illustrative embodiments, as shown in FIG. 1e, the electrode material 116B may be provided in the form of two or more material layers, such as a material layer 118, which may represent an appropriate work function metal species, such as aluminum, while a further portion of the electrode material 116B may be provided in the form of a layer 119 representing a conductive material having a high internal stress level that is appropriate for enhancing performance of the transistor 150B. For example, a plurality of metal-containing materials, such as tungsten, tantalum nitride, titanium nitride and the like, may be provided with a high internal compressive stress level, which may be approximately three GigaPascal and higher, thereby obtaining a desired high compressive strain component in the channel region 155, which may thus add to the strain induced by the material 154, if provided. The materials 118, 119, may be deposited on the basis of any appropriate deposition technique, such as physical vapor deposition, electrochemical deposition, CVD and the like.

It should be appreciated that, in the embodiment shown in FIG. 1e, the etch mask 130 (FIG. 1d) has been removed prior to the deposition of the electrode material 116B. In other cases, the etch mask may still be above the transistor 150A and may, thus, provide superior integrity of the gate electrode structure 110A. In this case, the etch mask may then be removed upon removing any excess material of the electrode material 116B.

Figure 1F:
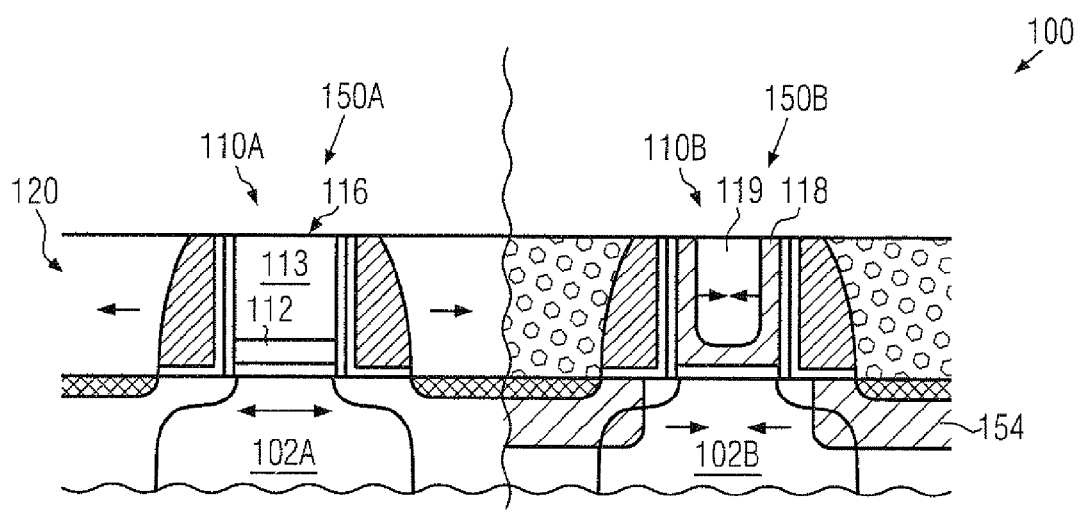

FIG. 1*f* schematically illustrates the semiconductor device 100 after the removal of any excess material. Hence, the gate electrode structure 110A comprises the electrode material 116 including the semiconductor portion 113 and the metal material 112 comprising the work function adjusting species for the transistor 150A, while the gate electrode structure 110B may include the work function species 118, possibly in combination with the material 119, having the desired conductivity and possibly providing an additional strain-inducing effect.

Figure 1G:
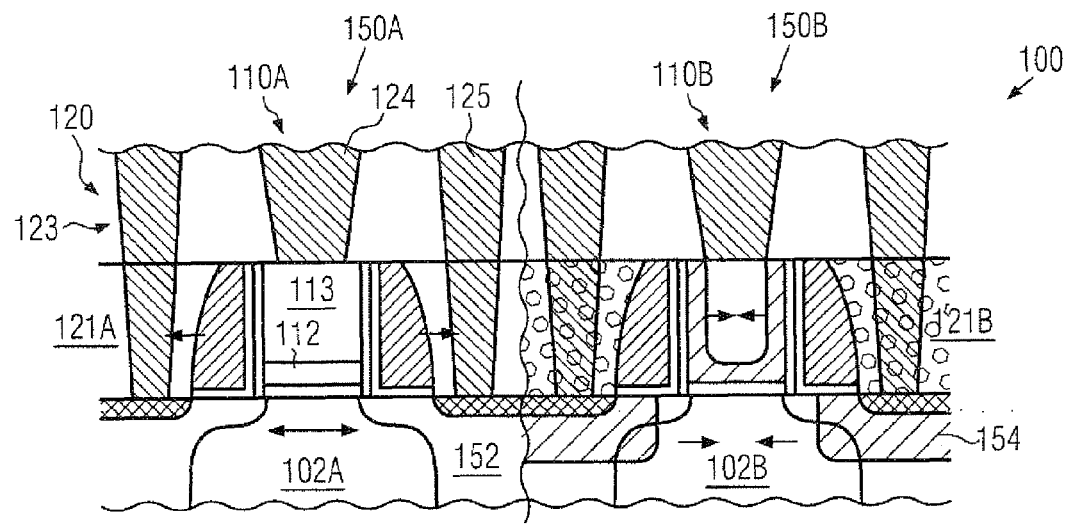

FIG. 1*g* schematically illustrates the semiconductor device 100 in a manufacturing stage in which the interlayer dielectric material 120 may comprise a further component 123, in which contact elements 124, 125 are formed so as to connect to the gate electrode structures 110A, 110B and to the drain and source regions 152, respectively. To this end, the material 123 may be deposited, for instance, in the form of a silicon dioxide material, followed by an appropriate patterning sequence for etching through the materials 123, 122, if provided, and 121A, 121B and refilling the resulting contact openings by any appropriate conductive material, such as tungsten and the like.

Figure 1H:
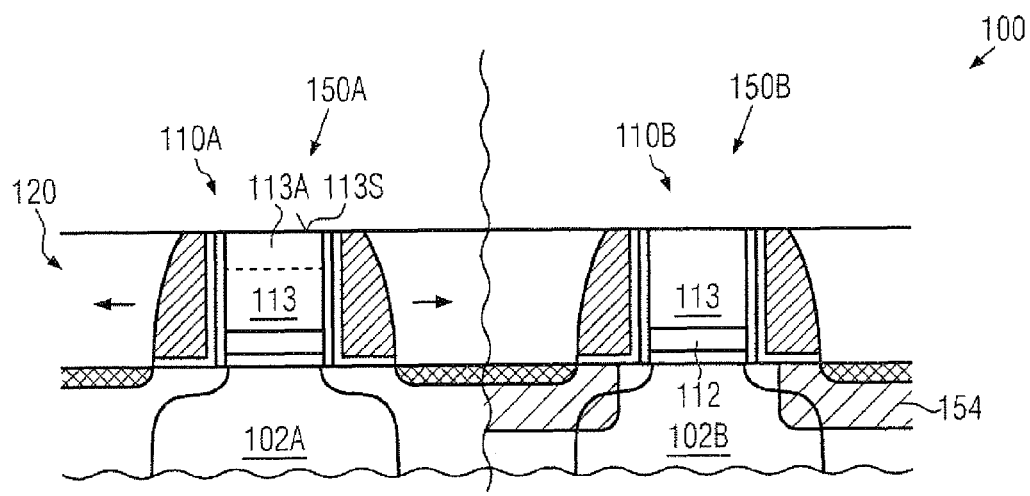
FIGS. 1h-1i schematically illustrate cross-sectional views of the semiconductor device in various manufacturing stages, in which a portion of the semiconductor-based electrode material may be removed in one type of gate electrode structures while completely replacing the electrode material in the other type of gate electrode structures, according to further illustrative embodiments.

FIG. 1*h* schematically illustrates the semiconductor device 100 in a manufacturing stage in which the surface 113S of the semiconductor-based material 113 in the gate electrode structures 110A, 110B is exposed. Furthermore, in the embodiment shown, the material 113 of the gate electrode structure 110A may include a modified portion 113A, which may result in a reduced removal rate upon performing an etch process for substantially completely removing the material 113 from the gate electrode structure 110B. For example, the modified portion may have incorporated therein implantation species, such as xenon and the like, which may result in a significantly reduced etch rate when performing well-established etch processes, for instance, on the basis of TMAH and the like. In other illustrative embodiments, a corresponding implantation species may be positioned at any appropriate height within the material 113 so as to act as an efficient etch stop material. Consequently, when performing an etch process for removing the material 113 from the gate electrode structure 110B, at least a significant portion of the material 113 may be preserved in the gate electrode structure 110A. Similarly, upon removing the metal-containing cap material 112 from the gate electrode structure 110B, a certain degree of material erosion may occur in the gate electrode structure 110A, while, nevertheless, a certain amount of the material 113 may be preserved. Consequently, the overall electronic characteristics, such as work function and, thus, threshold voltage in the transistor 150A may be preserved, while, on the other hand, a metal may be incorporated into the gate electrode structure 110A during the further processing, thereby improving overall conductivity and, in particular, reducing contact resistivity.

Figure 1I:
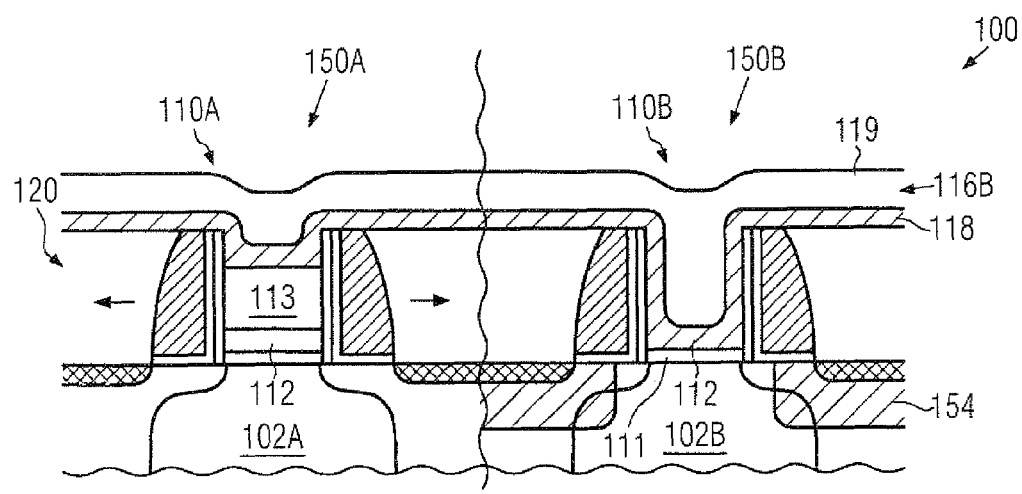

FIG. 1*i* schematically illustrates the device 100 after the deposition of the electrode material 116B, which, thus, replaces the material 113 (FIG. 1*h*) of the gate electrode structure 110B. For example, as previously explained, the material 116B may be provided in the form of two or more different material layers, such as the layers 118, 119. It should further be appreciated that the presence of the material layer 118, which may represent a material having an appropriate work function for the gate electrode structure 110B, may not negatively affect the gate electrode structure 110A in terms of threshold voltage and, thus, work function, since these characteristics are determined by the material 111, while the remaining portion of the material 113 may act as an efficient buffer material. On the other hand, the materials 118 and 119 may have a significantly higher conductivity compared to the initial semiconductor material 113. Furthermore, it is to be noted that the material 119 and/or the material 118 may be provided with a desired internal stress level, as discussed above, which may, however, have a significantly reduced influence on the transistor 150A due to the presence of the "buffer material" 113. In other cases, the material 116B may be provided as a substantially stress neutral material.

Consequently, the gate electrode structure 110A may receive a highly conductive metal-containing material in the form of the material 116B, thereby further enhancing performance of the gate electrode structure 110A, while not affecting work function and threshold voltage. In other illustrative embodiments (not shown), a corresponding highly conductive metal-containing area in the semiconductor material 113 may be formed on the basis of a silicidation process, for instance, starting from the configuration as shown in FIG. 1*h* and masking the gate electrode structure 110B. Thereafter, any appropriate metal may be deposited and a silicidation process may be initiated. In other illustrative embodiments (not shown), the dielectric cap material 115 (FIG. 1*c*) may be selectively removed from the gate electrode structure 110A prior to forming the metal silicide regions 153 (FIG. 1*c*), thereby also initiating silicidation of a portion of the gate electrode material 113 in the structure 110A, while the gate electrode structure 110B may be reliably covered by the dielectric cap material of FIG. 1*c*.

Figure 1J:
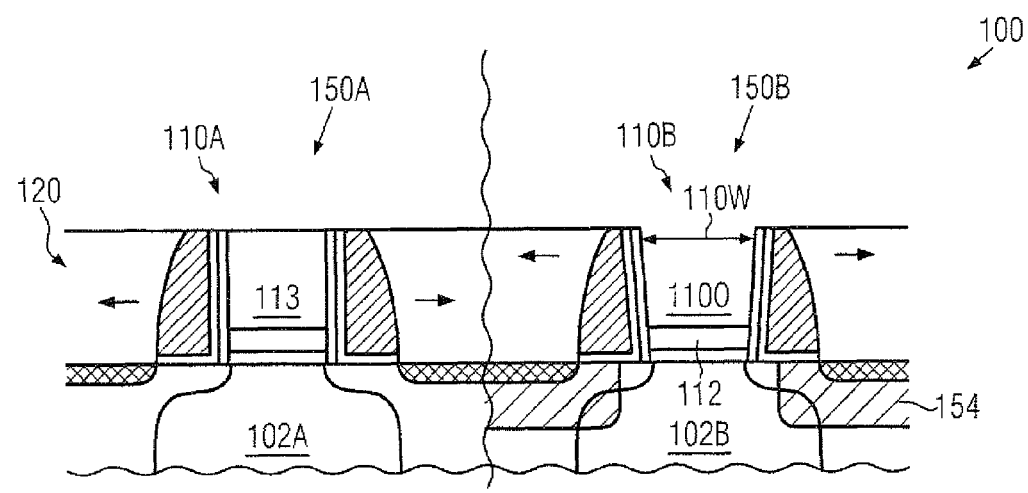
FIGS. 1j-1k schematically illustrate cross-sectional views of the semiconductor device according to still further illustrative embodiments, in which a superior cross-sectional shape of a gate opening during the replacement gate phase may be obtained on the basis of a tensile stressed interlayer dielectric material, which may be relaxed after refilling the gate opening.

FIG. 1*j* schematically illustrates the semiconductor device 100 according to further illustrative embodiments in which process conditions upon replacing the semiconductor-based electrode material with a highly conductive electrode material including an appropriate work function metal for the gate electrode structure 110B may be enhanced.

Figure 1K:
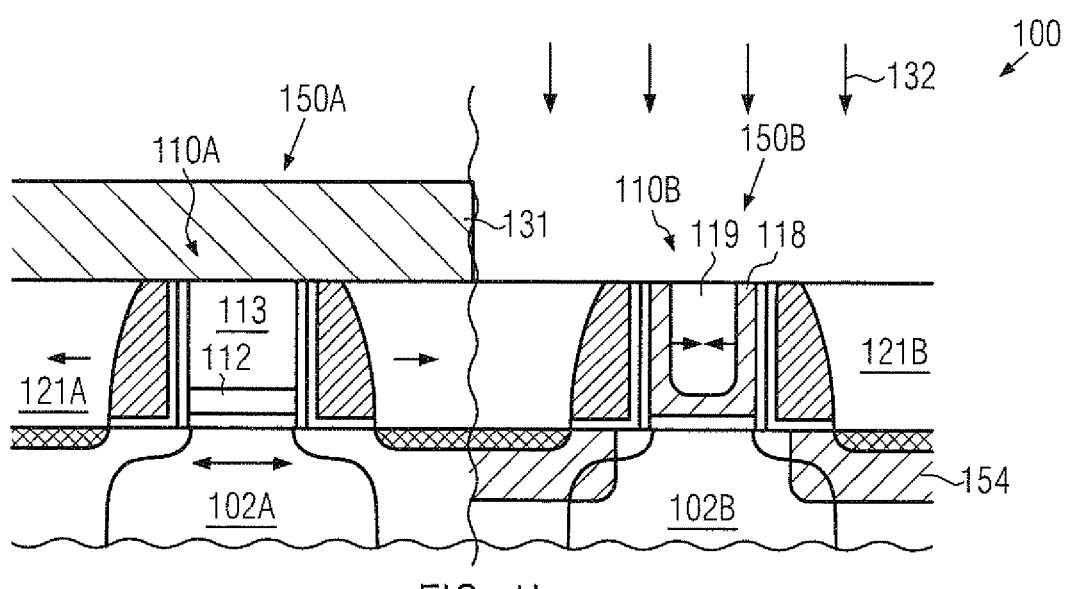

As illustrated, the gate opening 110O is formed in the gate electrode structure 110B, which may be accomplished on the basis of any appropriate process strategy as discussed above. Moreover, the interlayer dielectric material 120 may be provided with a high internal tensile stress level, which is also present in the transistor 150B. Consequently, upon forming the opening 110O, the tensile stress component of the dielectric material 120 may result in a tapered cross-sectional shape of the opening 110O, thereby increasing a width 110W of the opening 110O at the top thereof, while a bottom of the opening 110O may have substantially the initial gate length. Consequently, upon depositing the electrode material for the gate electrode structure 110B, superior process conditions during the deposition may be achieved, since, for instance, any overhangs that may form at the top of the opening 110O may have a significantly reduced influence on the further fill behavior. Consequently, the opening 110O may be filled without causing deposition-related non-uniformities, such as seams and voids, due to the increased width 110W. After filling the opening 110O, the processing may be continued as described above, i.e., any excess material may be removed, for instance, by CMP and the like. It should be appreciated that, as discussed above, the corresponding electrode material or at least a portion thereof may be deposited with a desired high internal stress level, such as a compressive stress level, if considered appropriate for the transistor 150B FIG. 1*k* schematically illustrates the semiconductor device 100 in a further advanced manufacturing stage in which an implantation mask 131 may cover the gate electrode structure 110A and the tensile stressed material 121A formed adjacent to the gate electrode structure 110A. On the other hand, the gate electrode structure 110B and the adjacent dielectric material may be exposed to an ion bombardment 132, which may be performed on the basis of an appropriate implantation species and process parameters so as to achieve a significant reduction of the internal stress level, thereby providing the dielectric material 121B. Consequently, any undesired influence of the tensile stress component on the transistor 150B may be eliminated or at least significantly reduced. Furthermore, if desired, the electrode structure 110B may provide a certain compressive strain component, for instance based on the material 119, as previously discussed.

As a result, the present disclosure provides semiconductor devices and manufacturing techniques in which a hybrid process strategy may provide gate electrode structures including high-k dielectric materials and work function metal species for one type of transistor at an early manufacturing, while the semiconductor-based electrode material in combination with the work function species may be replaced in the other type of gate electrode structure in a very advanced manufacturing stage. Consequently, the entire process flow is more robust against the process variations compared to complex gate first and replacement gate approaches, as previously described. Furthermore, in some illustrative embodiments, the provision of a silicon/germanium mixture as a part of the channel region of the P-channel transistors may be avoided, thereby improving device performance, stability and inducing less process-induced variations. Additionally, strain-inducing mechanisms may be implemented, for instance in the form of a strained electrode material, thereby even further enhancing overall product performance. The field effect transistors formed in accordance with the principles disclosed herein may be used for any complex semiconductor device, such as high performance circuits, low power products, in combination with SOI architecture, bulk configuration and globally strained substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first gate electrode structure of a first transistor and a second gate electrode structure of a second transistor, said first and second gate electrode structures consisting of the same gate layer stack of materials including a gate dielectric material and a first electrode material comprising a first work function adjusting metal species for adjusting a work function of said first gate electrode structure;
    forming drain and source regions of said first and second transistors;
    removing said first electrode material from said second gate electrode structure after forming said drain and source regions so as to form a gate opening while preserving at least a portion of said first electrode material in said first gate electrode structure; and
    filling said gate opening with a second electrode material comprising a second work function adjusting metal species for adjusting a work function of said second gate electrode structure.

2. The method of claim 1, wherein removing said first electrode material from said second gate electrode structure comprises exposing a surface of said first electrode material in said first and second gate electrode structures and forming a mask so as to cover said first gate electrode structure.

3. The method of claim 1, wherein removing said first electrode material from said second gate electrode structure comprises selectively modifying an etch behavior of at least a portion of said first electrode material in one of said first and second gate electrode structures.

4. The method of claim 1, further comprising forming at least a portion of an interlayer dielectric material laterally adjacent to said first and second gate electrode structures, wherein said at least a portion of the interlayer dielectric material has an internal stress level so as to induce a strain in channel regions of said first and second transistors.

5. The method of claim 4, further comprising selectively reducing said internal stress level in one of the first and second transistors prior to removing said first electrode material from said second gate electrode structure.

6. The method of claim 1, wherein said internal stress level is a tensile stress and wherein the method further comprises selectively reducing said internal stress level in said second transistor after filling said gate opening with said second electrode material.

7. The method of claim 1, wherein filling said gate opening with a second electrode material comprises depositing at least a portion of said second electrode material with an internal stress level so as to induce a strain in a channel region of said second transistor.

8. The method of claim 1, further comprising forming a metal-containing material in said first gate electrode after forming said drain and source regions.

9. The method of claim 8, wherein forming a metal-containing material in said first gate electrode structure comprises forming a metal silicide.

10. The method of claim 8, wherein forming a metal-containing material in said first gate electrode structure comprises replacing a portion of said first electrode material with said second electrode material.

11. The method of claim 1, wherein said first transistor is an N-channel transistor and said second transistor is a P-channel transistor.

12. The method of claim 1, wherein forming said first and second gate electrode structures comprises forming a gate dielectric material comprising a high-k dielectric material above a first active region of said first transistor and a second active region of said second transistor and forming said first electrode material on said gate dielectric material by forming a metal-containing cap layer and a semiconductor material.

13. A method of forming a semiconductor device, the method comprising:
    forming a gate layer stack of materials above a first active region of a first transistor and a second active region of a second transistor, said gate layer stack of materials comprising a gate dielectric material and a first metal-containing electrode material having a first work function adjusting metal species that is appropriate for said first transistor;
    forming a first gate electrode structure on said first active region and a second gate electrode structure on said second active region, wherein said first and second gate electrode structures have the same gate layer stack of materials; and replacing said first metal-containing electrode material in said second gate electrode structure with a second electrode material having a second work function adjusting metal species that is appropriate for said second transistor.

14. The method of claim 13, wherein replacing said first metal-containing electrode material in said second gate electrode structure comprises forming said second electrode material so as to induce a strain in a channel region of said second transistor.

15. The method of claim 13, further comprising implementing a strain-inducing mechanism in at least one of said first and second transistors prior to replacing said first metal-containing electrode material in said second gate electrode structure with said second electrode material.

16. The method of claim 15, wherein implementing a strain-inducing mechanism comprises forming a strained semiconductor material in drain and source regions of at least one of said first and second transistors.

17. The method of claim 15, wherein implementing a strain-inducing mechanism comprises forming a stressed dielectric material laterally adjacent to at least one of said first and second gate electrode structures.

* * * * *